United States Patent [19]

Naritake

[11] Patent Number: 5,995,403
[45] Date of Patent: Nov. 30, 1999

[54] DRAM HAVING MEMORY CELLS EACH USING ONE TRANSFER GATE AND ONE CAPACITOR TO STORE PLURAL BIT DATA

[75] Inventor: Isao Naritake, Tokyo, Japan

[73] Assignee: NEC Corporation, Tokyo, Japan

[21] Appl. No.: 08/822,237

[22] Filed: Mar. 20, 1997

[30] Foreign Application Priority Data

Mar. 29, 1996 [JP] Japan ..................................... 8-103822

[51] Int. Cl.$^6$ ...................................................... G11C 5/06
[52] U.S. Cl. ........................ 365/63; 365/149; 365/230.03
[58] Field of Search ........................ 365/63, 149, 230.03

[56] References Cited

U.S. PATENT DOCUMENTS

| | | | |
|---|---|---|---|
| 5,274,598 | 12/1993 | Fujii et al. ............................. | 365/205 |
| 5,353,255 | 10/1994 | Komuro ................................. | 365/208 |
| 5,652,756 | 7/1997 | Tsukude et al. ........................ | 365/203 |
| 5,661,686 | 8/1997 | Gotou ................................. | 365/185.23 |

FOREIGN PATENT DOCUMENTS 316094  1/1991  Japan .

*Primary Examiner*—David Nelms
*Assistant Examiner*—Hoai V. Ho
*Attorney, Agent, or Firm*—Whitham, Curtis & Whitham

[57] ABSTRACT

In a dynamic type semiconductor memory device having a classified bit line structure, a feedback capacitor is provided between sub-bit lines and main bit lines of a sub-sense amplifier. A voltage difference read out on the sub-bit lines is transferred to the main bit lines, the read out voltage difference is amplified by a main sense amplifier, and data of superordinate bits is read out. At the same time, the data on said main bit lines is fed back to the sub-bit lines through the capacitor. Thereafter, a reading operation from the sub-bit lines to the main bit lines is performed again, thereby enabling a reading operation for data of subordinate bits. Thus, in a dynamic type semiconductor memory device having a conventional memory cell structure, data for two bits can be stored in one memory cell.

6 Claims, 13 Drawing Sheets

DRAM HAVING MEMORY CELLS EACH USING ONE TRANSFER GATE AND ONE CAPACITOR TO STORE PLURAL BIT DATA

BACKGROUND OF THE INVENTION

1. Field of the Invention

The present invention relates to a semiconductor memory device and, more particularly, to a DRAM (dynamic random access memory) type semiconductor memory device wherein each of dynamic memory cells is constructed to store a plurality of bit data.

2. Description of the Related Art

A semiconductor memory device of this kind, as disclosed in Japanese Laid-Open Patent Publication Hei 3-16094, structures each of memory cells to include two transistors and one capacitor to store two bit data.

Describing in more detail with reference to FIG. 10, each memory cell array comprises a plurality of memory cells 20. Each memory cell stores data for two bits with one capacitor. In the memory cell, reference numeral 21 denotes a storage capacitor; 22 and 23, transfer gates for reading out data stored in the storage capacitor 21 on bit lines; and 24 and 25, storage nodes. The reference numerals 26 and 27 denote sense amplifiers.

Referring to the input timing waveforms shown in FIG. 11, when bit line equalize control signals NEQ and PEQ change at time t0, all transistors in a bit line equalize circuit are turned off, whereby precharging for bit lines is completed and bit line voltages at all bit lines become equal to ½ Vcc.

Subsequently, when a memory cell 20 connected to a pair of bit lines BL1 and /BL2 (symbol "/" denotes a complementary signal) is selected, a signal CUT2 makes transistors of a cut off circuit of a sense amplifier turn off. Thus, a voltage at a word line WLL1 is raised up at time t1.

Upon being raised up of the word line WLL1, data stored in the storage capacitor 21 is transferred as charges to bit lines BLL1, BLR1, SBL1, SBL2, and /BLL1, /BLR1, /SBL1, /SBL2.

At time t2, when signals CUT1 and REQ are dropped, the bit line and the sense amplifier located at the memory cell side are separated from each other, whereby bit lines SBL1, SBL2 and /SBL1, /SBL2 are also separated from each other, respectively. Thus, the sense amplifiers 26 and 27 will individually hold the same data of the memory cell 20. At time t3, signals UP and DOWN are changed.

Thereafter, at time t4, the sense amplifier starts its sense amplifying operation upon receipt of a signal /SAS. At time t5, the signals CUT1 and CUT2 are raised up so that the sense amplifier and the bit line located at the memory cell side are connected to each other, thereby performing a pulling-up operation with a signal /SAS.

Finally, at time t6, a signal CSEL is dropped, whereby the amplified data in the memory cell is transferred to a data line. Thus, a reading operation is completed.

Since the conventional semiconductor memory device stores data for two bits at one storage capacitor, as is shown in Table 1, there are four states of voltages at the storage nodes 24 and 25 when data is being held in the memory cell. Data illustrated in Table 1 indicates information that is provided to data lines D1 and D2, and "H" corresponds to a voltage Vcc, "L", a voltage GND.

TABLE 1

| DATA | D1 = H, D2 = H | D1 = H, D2 = L | D1 = L, D2 = H | D1 = L, D2 = L |
|---|---|---|---|---|
| NODE 14 | Vcc | 2/3 Vcc | 1/3 Vcc | GND |
| NODE 15 | GND | 1/3 Vcc | 2/3 Vcc | Vcc |

In Table 1, FIG. 12 shows the waveforms at the bit lines SBL1 and SBL2 when the data are read out from the data lines D1 and D2 at a level "H". FIG. 13 shows the waveforms at the bit lines SBL1 and SBL2 when data are read out from the data line D1 at the level "H" and the data line D2 at a level "L".

In the case where the data is read out from the data lines D1 and D2 at the level "H", at time 1 when the voltage at the word line is raised up, a potential difference ΔV occurs between the bit lines which are in a complementary relationship. At time t3, the signals UP and DOWN increase the voltages of the bit lines SBL1 and /SBL2 by ⅓ ΔV. On the other hand, the signal UP and DOWN decreases the voltages of the bit lines /SBL and SBL2 by ⅓ ΔV.

However, the voltages at bit lines SBL1 and /SBL1 are not reversed in level. The voltages at the bit lines SBL2 and /SBL2 are not also reversed in level. After the sense amplifier starts its amplifying operation at time t4, signals at the level Vcc are output from the data lines D1 and D2.

On the other hand, in the case where data are read out from the data line D1 at the level "H" and the data line D2 at the level "L", at time t1 when the voltage at the word line is raised up as shown in FIG. 13, the potential difference as little as ⅓ ΔV occurs between the pair of the bit lines which are in the complementary relationship. Thus, at time t3, the voltages at the bit lines SBL1 and /SBL2 are increased by ⅓ ΔV by the signals UP and DOWN. On the other hand, the voltages at the bit lines /SBL1 and SBL2 are reduced by ⅓ ΔV. Thus, the voltages at the bit lines SBL2 and /SBL2 are reversed in level. Therefore, after the sense amplifier starts its amplifying operation at time t4, a signal at the level Vcc is output from the data line D1 and a signal at the level GND is output from the data line D2.

However, the foregoing semiconductor memory device has the memory cell array structure different from that of the conventional general DRAM, which has a memory cell consisting of one transistor and one capacitor. Therefore, a manufacturing method of the semiconductor memory device is also different.

Furthermore, two wirings must be drawn out from the both electrodes of the capacitor through the two transistors to the complementary bit lines, respectively. When it is intended to make the semiconductor memory device having such memory cell structure with a high integration, it is difficult to lay out elements symmetrically in the semiconductor memory device. This brings about a degrade of a margin such as a reading out margin.

SUMMARY OF THE INVENTION

It is therefore a main object of the present invention is to provide a dynamic type semiconductor memory device capable of storing data for a plurality of bits in one memory cell by a simplified cell structure.

A semiconductor memory device according to one aspect of the present invention includes a main bit line, a sub-bit line, a first sense amplifier connected to said main bit lines, a second sense amplifier coupled to said sub-bit lines, and a capacitor and a transfer gate coupled in series between the main bit line and the sub-bit line.

Preferably, one terminal of said capacitance element is connected to said second bit lines and the other terminal thereof is connected to one signal terminal of said transfer gate having the other terminal connected to said first bit lines. It is further appreciated that the second sense amplifier and said first sense amplifier are sequentially energized two times, respectively. A result of the first amplification for the first bit lines is transferred to said second bit lines through the said capacitance element and said gate transfer. A potential difference read out from the selected memory cell on said bit lines is made different from that in the second amplification, and then the second energization for the first sense amplifier is performed.

BRIEF DESCRIPTION OF THE DRAWINGS

The above and other objects, advantages and features of the present invention will be become more apparent from the following description taken in conjunction with the accompanying drawings, in which.

DETAILED DESCRIPTION OF THE PREFERRED EMBODIMENTS

Figure 1:
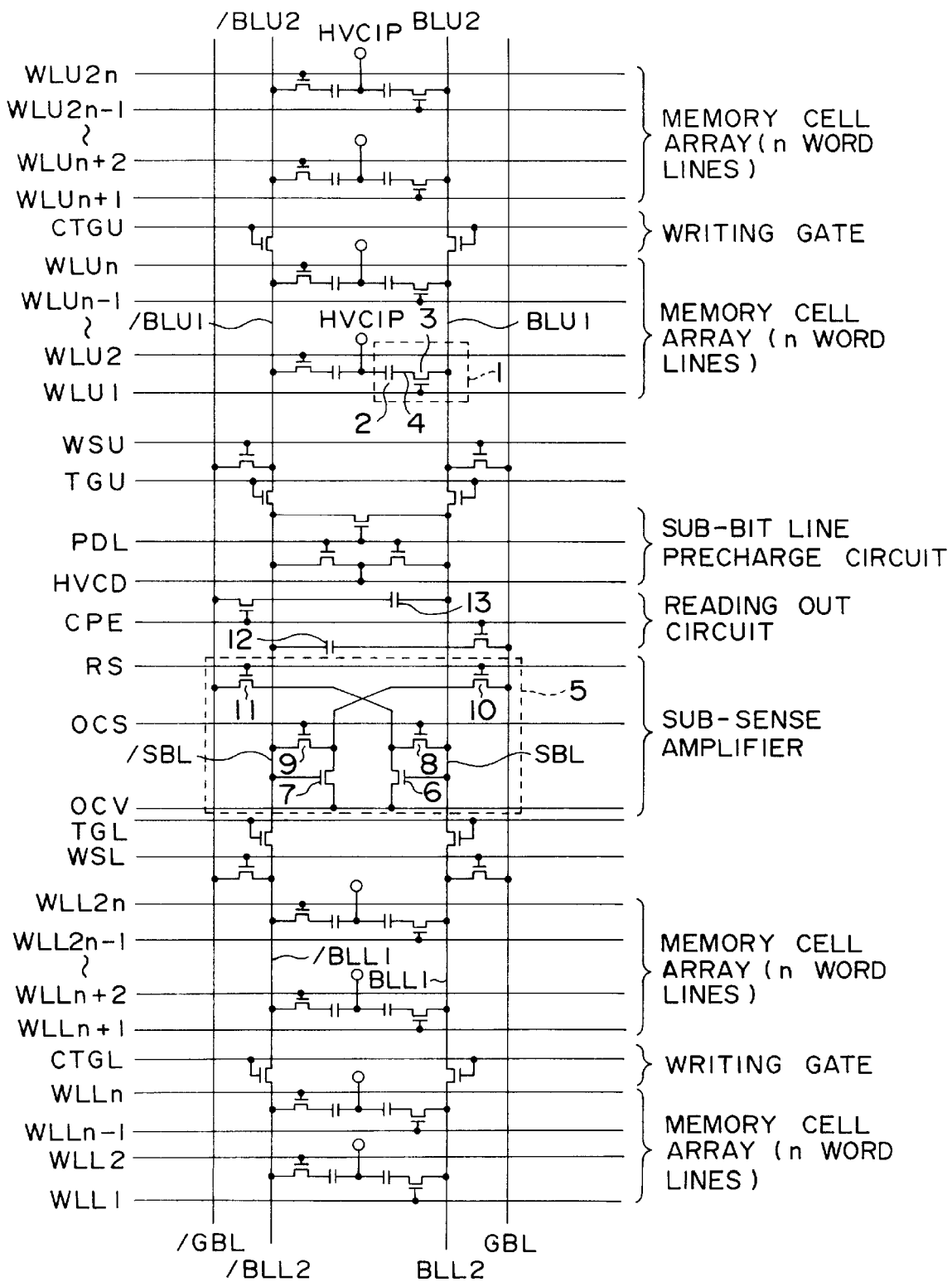
FIG. 1 is a circuit diagram showing a constitution of a semiconductor memory device of a first embodiment of the present invention.

Referring now to FIG. 1, in a semiconductor memory device of a first embodiment according to the present invention, reference numeral 1 denotes a memory cell in the dynamic type semiconductor memory device; 2, a storage capacitor; 3, a transfer gate; 4, a storage node; and 5, a sub-sense amplifier. Bit lines are classified into main bit lines and sub-bit lines which are in a complementary relationship. One main sense amplifier and a plurality of sub-sense amplifiers (not shown) are connected to a pair of the main bit lines.

As will be described below in detail, a feedback capacitor 12 is arranged between the sub-bit line /SBL and the main bit line GBL and a feedback capacitor 13 is arranged between the sub-bit line SBL and the main bit line /GBL. A potential difference read out on the sub-bit lines from the selected memory cell is transferred to the main bit lines. The transferred potential difference to the main bit lines is amplified by a main sense amplifier (not shown) so that more significant bit data is first read out. At the same time, data on the main bit lines is fed back to the sub-bit lines via the feedback capacitor. Thereafter, the reading operation of the data from the sub-bit lines to the main bit lines is performed again, whereby less significant bit data can be read out. Furthermore, provided is a transfer gate between the sub-bit lines to separate them from each other. An individual voltage is written to the corresponding sub-bit lines located at the transfer gate side. Thereafter, the transfer gate is activated, and the charges are divided whereby four states are written to the memory cell.

The semiconductor memory device of the first embodiment of the present invention will be described in more detail, by explaining an operation of the device.

First, a reading operation of the memory cell 1 selected by the word line WLU1 and the bit line BLU1 will be described.

Figure 2:
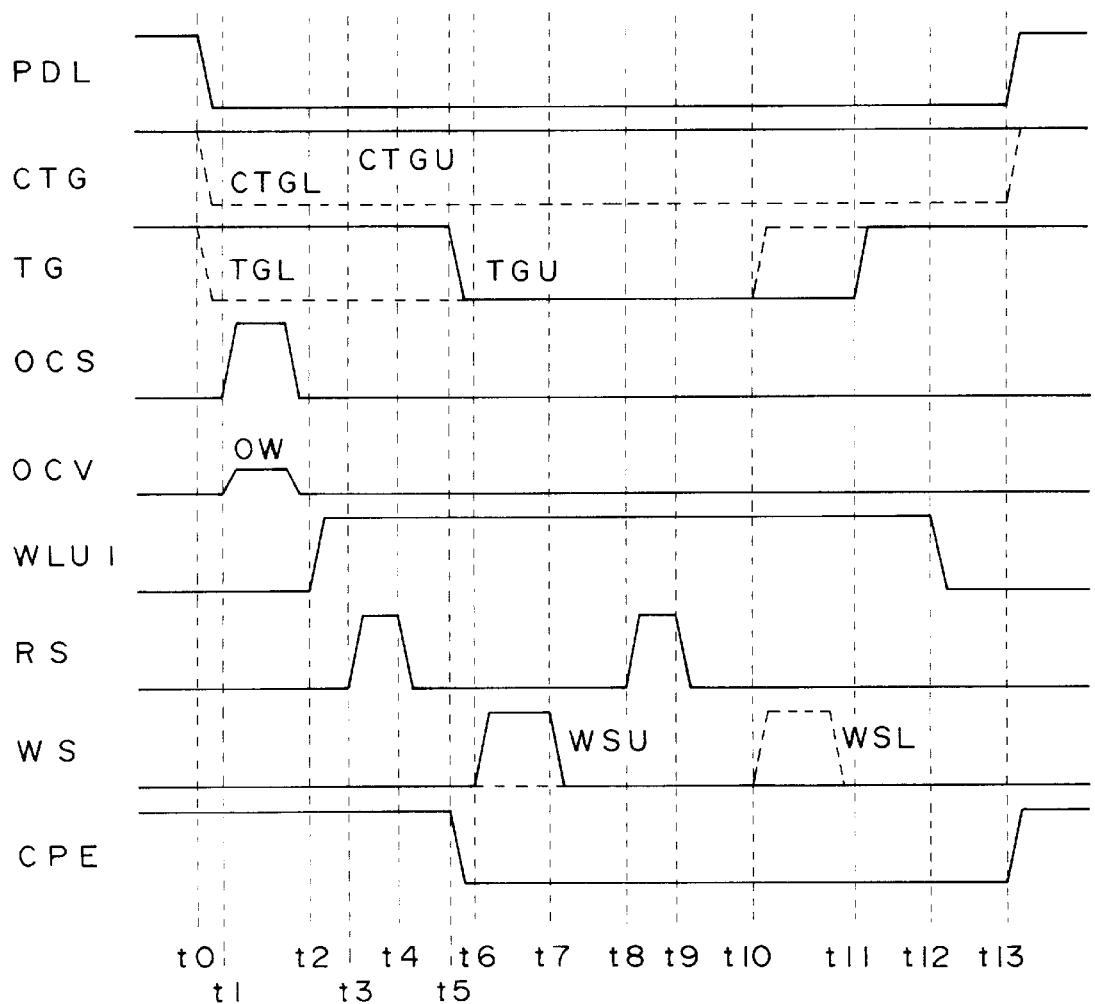
FIG. 2 shows input timing waveforms for explaining reading and write operations of the semiconductor memory device of the first embodiment of the present invention.

Referring to FIG. 2, when a precharge control signal PDL for the sub-bit line changes from the level "H" to the level "L" at time t0, all of the transistors in the sub-bit line precharge circuit are turned off, whereby a precharge operation for the sub-bit line is completed. The voltages at the sub-bit lines BLU1, /BLU1, BLU2, /BLU2, SBL, /SBL, BLL1, /BLL1, BLL2, and /BLL2 are kept at ½ Vcc.

At time t0, the control signal CTGL for controlling the transfer gate serving as a gate for data writing changes from the level "H" to the level "L", as shown in FIG. 2. At the same time, the control signal TGL for controlling the transfer gate arranged between the sub-bit lines also changes from the level "H" to the level "L". The transistors which receive the signals CTGL and TGL at their gates are turned off, whereby the sub-bit lines SBL and /BLL1, /SBL and /BLL1, BLL1 and BLL2, and /BLL1 and /BLL2 are separated from each other, respectively.

Subsequently, when signals OCS and OCV for offset cancelling of the sub-sense amplifier change at time t1, as shown in FIG. 2, the transistors 8 and 9 which receive the signals OCS and OCV at their gates are turned on, whereby the transistors 6 and 7 connect the sub-bit lines SBL to the line supplying the signal OCV, as well as the line /SBL to the line supplying the signal OCV. Specifically, at this time, these lines SBL and OCV, and /SBL and OCV are so called diode-connected by the transistors 6 and 7. Assuming that at this time, a level of the signal OCV is OVV and threshold voltages of the transistors 6 and 7 are VTH6 and VTH7, respectively, the voltages at the sub-bit lines SBL and /SBL become OVV+VTH6 and OVV+VTH7, respectively.

With the above-described operations, variations of the threshold voltages of the transistors of the sense amplifier due to variations of manufacturing will be corrected.

Thereafter, by reading out the data of the memory cell on the sub-bit lines, deterioration in reading-out margin due to the variation of the threshold voltage can be prevented. It should be noted that when the threshold voltages of the sense amplifier transistors 6 and 7 are set VTH, the level of the signal OVV must be set ½ Vcc−VTH−α (α: predetermined voltage value).

Hereinafter, for the simplicity of the description, the description will be made assuming that VTH6 and VTH7 are equal, specifically, the threshold voltages have no variations.

After completion of the correction operation for the variations in the foregoing threshold voltages, at time t2, the word line LU1 is changed from the level "L" to the level "H". The transfer gate 3 is turned on, whereby the data stored in the storage capacitor 2 is transferred to the sub-bit lines BLU2, BLU1, and SBL.

In the memory cell of the semiconductor memory device of the first embodiment according to the present invention, the data for two bits is stored in one storage capacitor, the voltage at the storage node 4 takes four states of the power source Vcc, ⅔ Vcc, ⅓ Vcc, and GND (ground potential). These four states correspond to 2-bits binary numbers "11", "10", "01", and "00", respectively.

Figure 3:
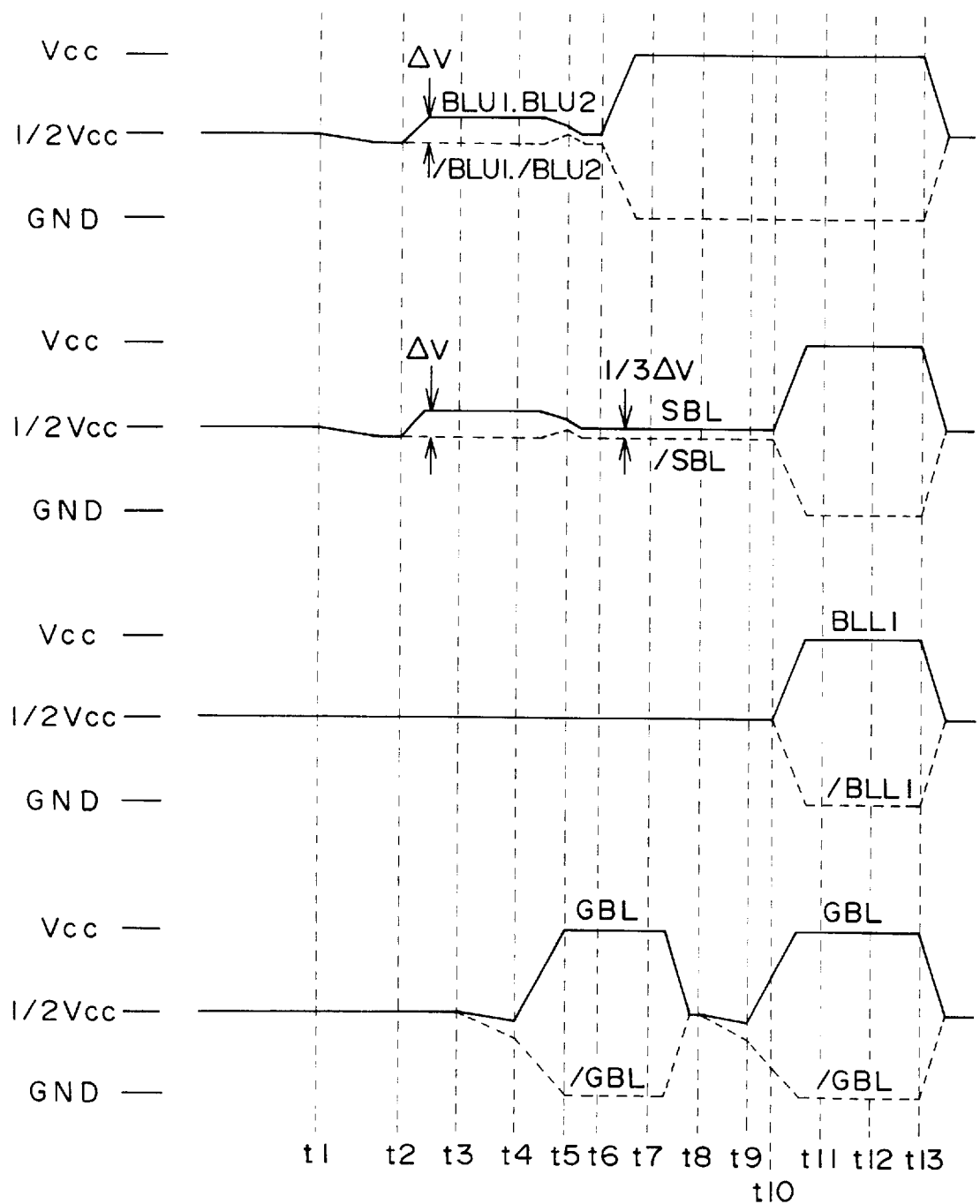
FIG. 3 shows waveforms for explaining a reading operation for bit lines of the semiconductor memory device of the first embodiment of the present invention.

The waveforms of the main bit lines and sub-bit lines at the time the data for the binary number "11" (Vcc) among these binary numbers is read out are shown in FIG. 3. The waveforms of the main bit lines and sub-bit lines at the time the data for the binary number "10" (⅔ Vcc) is read out are shown in FIG. 4.

After the level at the word line WLU1 rises at time t2, when the memory cell keeps the data "11", the potential difference having the value of ΔV occurs between the pair of the complementary bit lines BLU1 and /BLU1 as shown in FIG. 3. When the memory cell keeps the data "10", the potential difference having the value of ⅓ ΔV occurs as shown in FIG. 4.

Subsequently, when the lead switch signal RS is changed from the level "L" to the level "H" at time t3 as shown in FIG. 2, the transistors 10 and 11 of the sub-sense amplifier are turned on. The potential at the main bit lines which have been precharged to ½ Vcc by means of a main bit line precharge circuit (not shown) is dropped according to the gate voltage of the sense amplifier transistors 6 and 7, that is, the level of the pair of the sub-bit lines. Thus, the potential difference read out at the pair of the sub-bit lines is transferred to the pair of the main bit lines GBL and /GBL.

Figure 4:
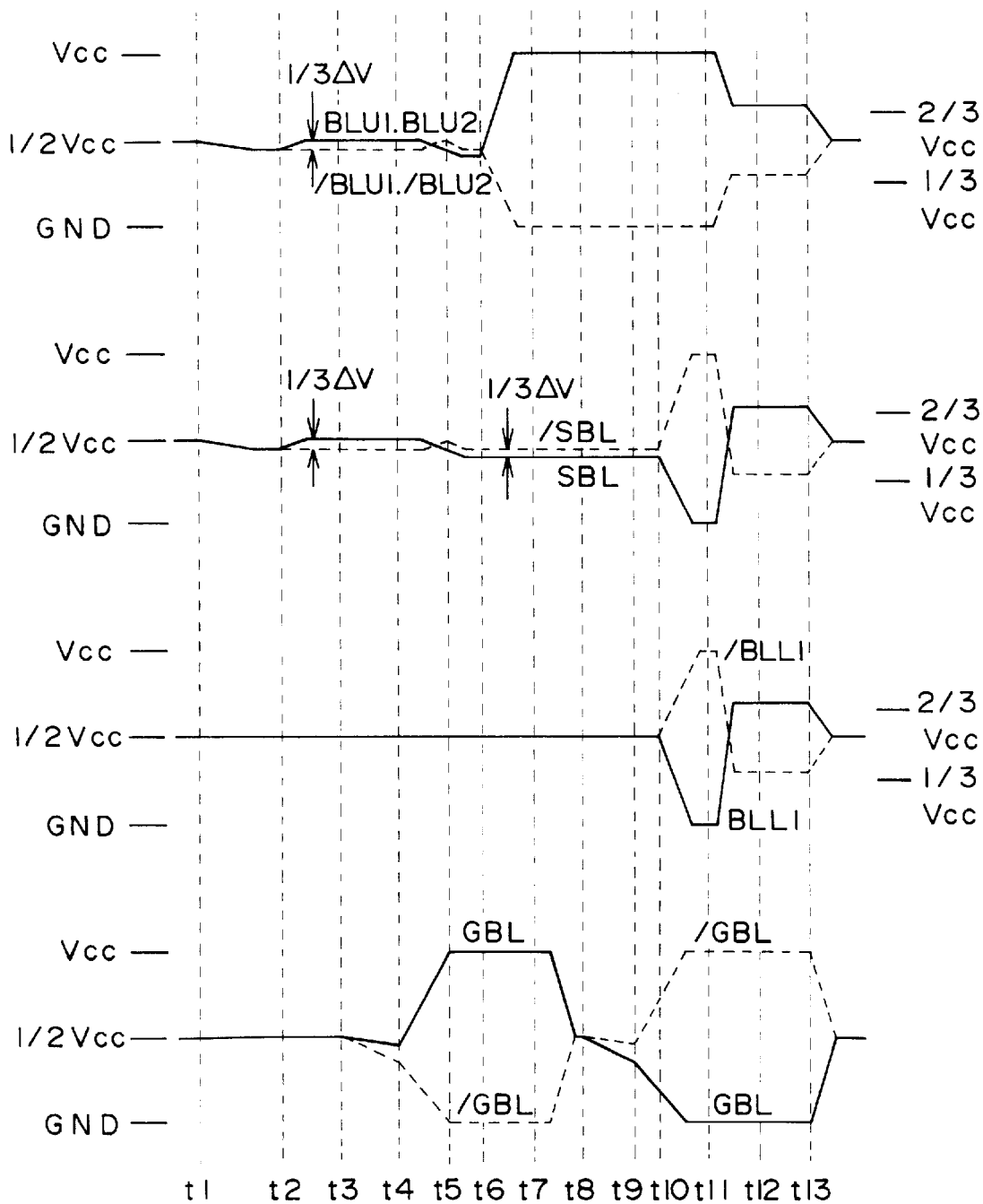
FIG. 4 shows waveforms for explaining a reading operation for bit lines of the semiconductor memory device of the first embodiment of the present invention.

Next, at time t4, the lead switch signal RS drops to the level "L" and activates the main sense amplifier, and the potential difference between the pair of the main bit lines GBL and /GBL is amplified by the main sense amplifier to the level Vcc or GND, as shown in FIGS. 3 and 4. At this time, when the memory cell keeps either the data "11" or the data "10" as shown in FIGS. 3 and 4, the main bit line GB1 is amplified to the level Vcc and the main bit line /GBL is amplified to the level GND. This indicates that the reading operation for the superordinate bits is being performed and, in either case, the data at the level "H" is read out. On the other hand, when the memory cell keeps either the data "01" or the data "00", the data at the level "L" is read out by this reading out operation for the superordinate bits.

While the main bit lines are being amplified, specifically, for the time of period from the time t4 to t5, the signal CPE for controlling the capacitors 12 and 13 and the turning-on/off of the transfer gates is kept at the level "H", the capacitors 12 and 13 being arranged between the main and sub-bit lines and the transfer gates being connected in series to corresponding capacitors. Therefore, the potential at the pair of the sub-bit lines is affected by the potential variation of the main bit lines due to the capacitors 12 and 13 of the reading circuit so that the potential at the pair of the sub-bit lines also varies.

When the memory cell keeps either the data "11" or the data "10", the potentials at the sub-bit lines SBL, BLU1, and BLU2 are elevated by ⅓ ΔV, and the potentials at the sub-bit lines /SBL, /BLU1, and /BLU2 are dropped by ⅓ ΔV. Thus, in the case shown in FIG. 4, the sub-bit lines SBL and /SBL are reversed in level. Specifically, the potential at the sub-bit line /SBL becomes lower than that at the sub-bit line SBL.

Subsequently, at time t5, the signals TGU and CPE are dropped to the level "L", the bit line and the sense amplifier in the memory cell are separated from each other. Thereafter, the potentials at the sub-bit lines will not be affected by the variations in the potentials of the main bit lines.

Next, at time t6, the write switch signal WSU rises up, the amplified potentials at the main bit lines are written to the sub-bit lines BLU1, BLU2, /BLU1, and /BLU2, respectively.

Thereafter, at time t7, the level of the write switch signal WSU drops and the main bit lines are precharged to ½ Vcc.

Subsequently, at time t8, the lead switch signal RS is energized again, whereby the potential difference between the sub-bit lines SBL and /SBL is transferred to the pair of the main bit lines GBL and /GBL and the potential difference between the sub-bit lines SBL and /SBL is amplified. At this time, when the memory cell is keeping the data "11", the data at the level "H" is read out as shown in FIG. 3. When the memory cell is keeping the data "10", as shown in FIG. 4, the sub-bit lines SBL and /SBL are reversed in level at the time the superordinate bits are read out. Therefore, the data at the level "L" is read out. The reading operation at this time corresponds to the reading operation for the sub-ordinate bits. FIG. 3 shows the reading operation for the data "11" and FIG. 4 shows the reading operation for the data "10".

When the memory cell also keeps either the data "01" or "00", either the data "01" or "00" is read out. Thereafter, at time t10, the signals WSL and TGL rises up as shown in FIG. 2, whereby the data of the main bit lines are written to the sub-bit lines SBL, BLL1, /SBL, and /BLL1, respectively.

When the memory cell keeps the data "10" after the level of the write switch signal WSL drops, for example, as shown in FIG. 4, the sub-bit lines BLU1 and BLU2 are at the level "Vcc" and the sub-bit lines SBL and BLL1 are at the level "GND".

When a parasitic capacitance of the sub-bit line BLU1 has a value of CB (quantity for the n word lines), parasitic capacitances of the sub-bit lines BLU2 and BLL1 will also be CS. Here, if a parasitic capacitance of the sub-bit line SBL is neglected because of its small quantity when comparing it with CB, when the signal TGU rises up at time t11, the sub-bit lines BLU2, BLU1, SBL, and BLL1 are connected each other. Thus, the voltage levels at the sub-bit line BLU1 and the storage node 4 will be ⅔ Vcc by the capacitative coupling as is expressed by the following formula (1).

$$(2CV \cdot Vcc + CB \cdot 0[V])/3CB = \tfrac{2}{3}\, Vcc \quad (1)$$

Thereafter, by dropping the level at the word line WLU1 at time t12, the voltage of ⅔ Vcc is written to the memory cell again, specifically, the data "10" is written to the memory cell again. The voltages at the sub-bit lines at the time of re-writing the data at four states of the data are shown in Table 2.

TABLE 2

|  | IMMEDIATELY BEFORE TIME t11 | | AFTER TIME t11 BLU1, BLU2, |
|---|---|---|---|
|  | BLU1,BLU2 | SBL,BLL1 | SBL, BLL1 |
| INFORMATION 11 | Vcc | Vcc | Vcc |
| INFORMATION 10 | Vcc | GNC | 2/3 Vcc |
| INFORMATION 01 | GND | Vcc | 1/3 Vcc |
| INFORMATION 00 | GND | GND | GND |

Here, the potential at the word line WLU1 rises up at the state that the memory cell keeps the data "11", specifically, the level of Vcc. In this situation, when the potential difference read out between the sub-bit lines BLU1 and BLU2 is denoted as $\Delta V$; the parasitic capacitance of the bit line which is equal to that for the n word lines, that is, the parasitic capacitance of the sub-bit lines BLU1 and BLU2, CB; the storage capacitance of the memory cell, CS; and the capacitance of the capacitors 12 and 13, CC, and when the capacitance of the bit lines of the sub-sense amplifier is neglected because of its small value compared with that of the bit line of the memory cell array, $\Delta V$ is given by the following formula (2).

$$\Delta V = CC/(CS+2CB+CC) \times \frac{1}{2} Vcc \quad (2)$$

Moreover, when the variation of the potential given to the sub-bit lines by the variation of the potential of the main bit lines through the capacitors 12 and 13 is equal to $\Delta V'$, the relation given by the following formula (3) is established.

$$(\frac{1}{2}) Vcc \times CC = (CS+2CB+CC) \times \Delta V' \quad (3)$$

Using the above formulas (1) and (2), when the value of CC is found, which gives the relation "$\Delta V' = \frac{1}{3} \Delta$", the following formula (4) is given. As is apparent from the formula (4), the value of CC may be equal to one third of the storage capacitance.

$$CC = \frac{1}{3} CS \quad (4)$$

The capacitance value equal to one third of the storage capacitance CS can be realized, for example, by connecting in series three storage capacitances.

Subsequently, a writing operation of the dynamic type semiconductor memory device of the first embodiment of the present invention will be described.

Input timing waveforms of the sub-sense amplifier on the writing operation are the same as those shown in FIG. 2. For the period of time when the write switch signals WSU and WSL are energized, that is, for the period of time from time t6 to time t7 and from time t10 to time t11, the signal amplified by the main sense amplifier according to the reading out data is re-written to the sub-bit lines from the main bit lines at the time of the reading out operation. At the time of the writing operation, the signal according to the writing data is written to the sub-bit lines from the main sense amplifier through the main bit lines.

For the period of time from time t6 to time t7, the write switch signal SU is kept at the level "H". If the data corresponding to the superordinate bit among the writing data, that is, the writing data, is either "11" or "10", the signal GBL is "L", and /GBL is "H". Thus, the data at "H" in level or "L" in level is written to the sub-bit lines BLU1 and BLU2.

Moreover, for the period of time from time t10 to time t11, the write switch signal WSL is kept at "H" in level. If the data corresponding to the subordinate bit among the writing data, that is, the writing data is either "11" or "01", the signal GBL is at "H" in level and the signal /GBL is "L" in level. If the writing data is either "10" or "00", the signal GBL is at "L" and the signal /GBL is "H" in level. In such situations, the data at "H" in level or "L" in level is written to the sub-bit line BLU1. Thereafter, at time t11, in the similar manner to the reading operation, the signal TGU for controlling the transfer gate rises up, which is arranged between the sub-bit lines BLU1 (/BLU1) and SBL (/SBL), whereby the four states shown in the above Table 2 can be written to the memory cell.

Next, a semiconductor memory device of a second embodiment of the present invention will be described with reference to the drawings.

Figure 5:
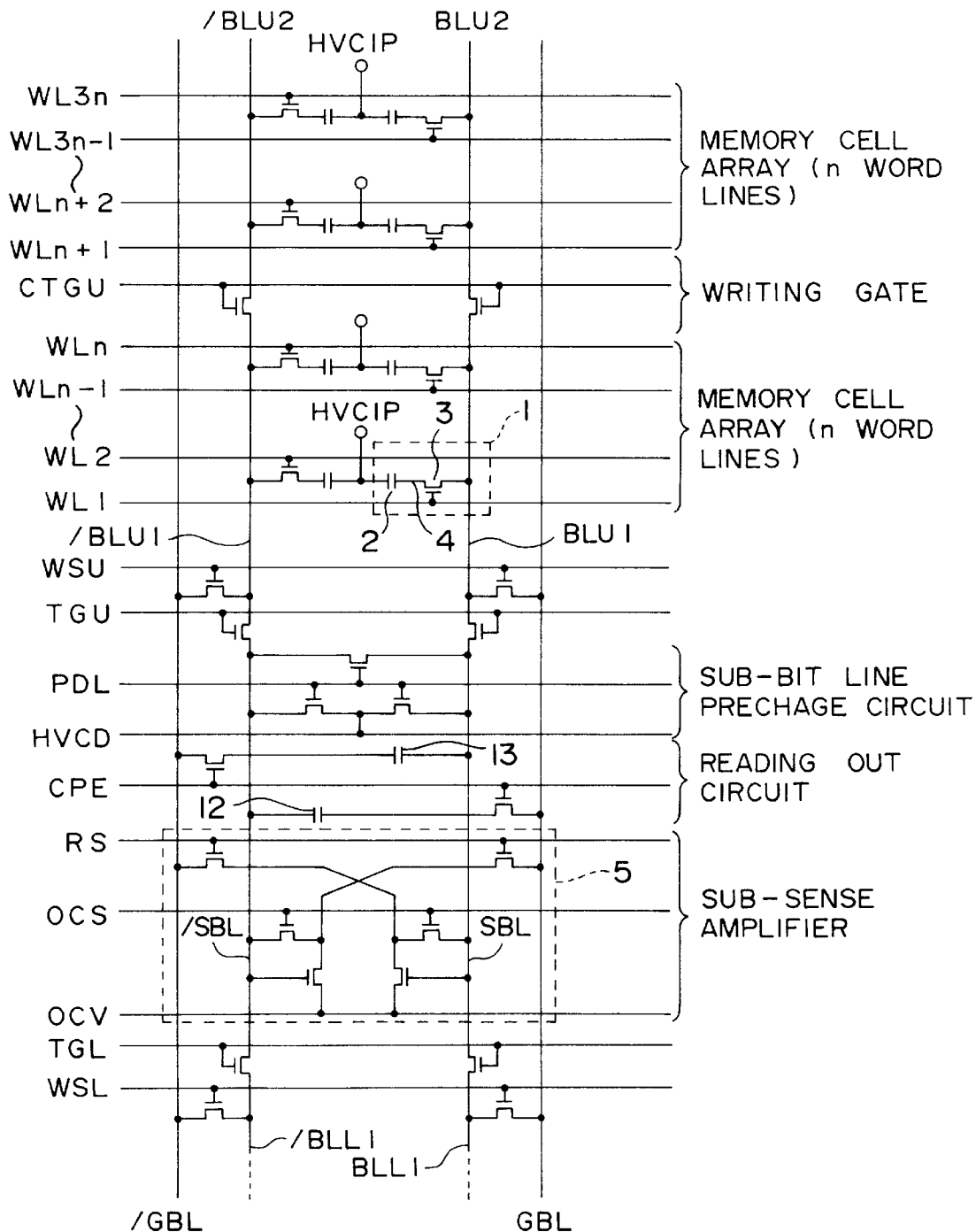
FIG. 5 is a circuit diagram showing a constitution of a semiconductor memory device of a second embodiment of the present invention.
Figure 6:
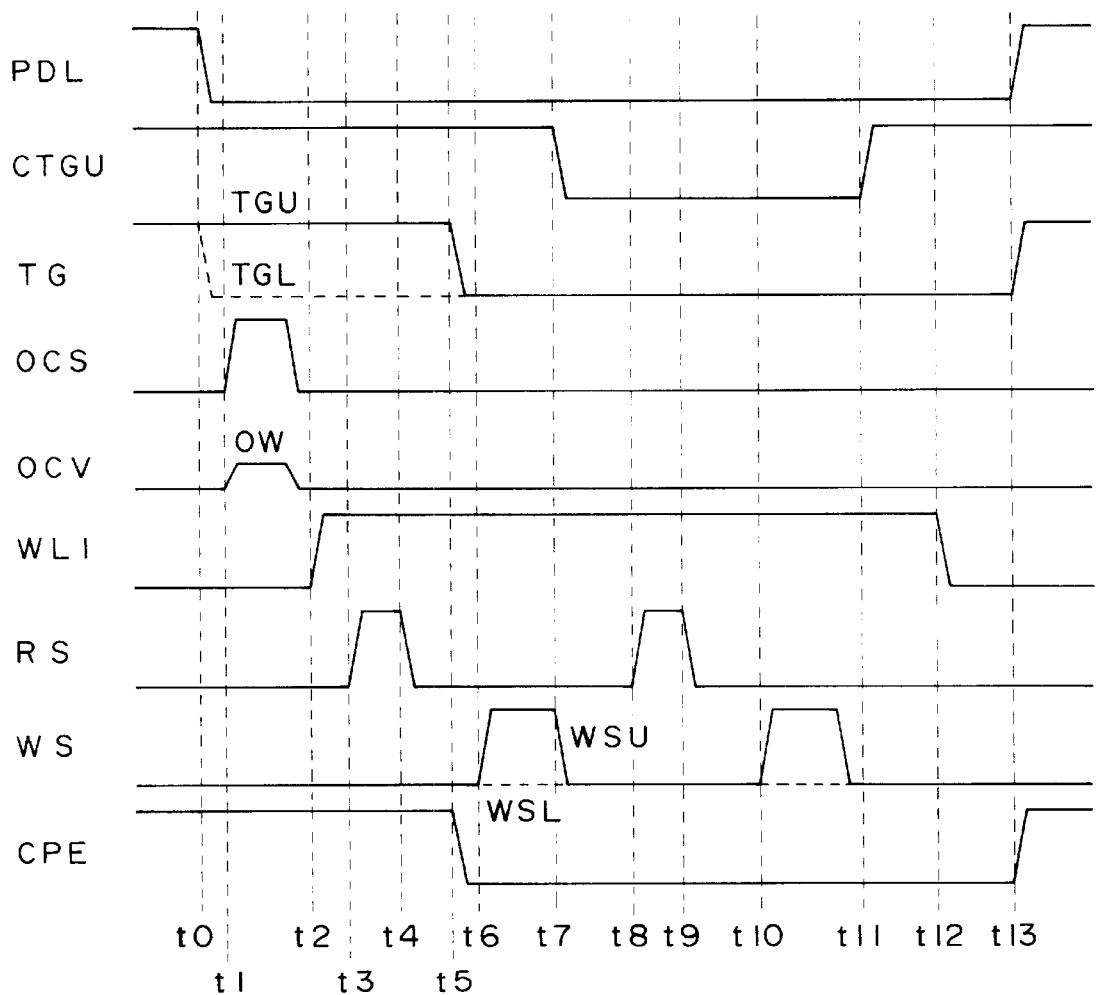
FIG. 6 shows input timing waveforms for explaining reading and writing operations of the semiconductor memory device of the second embodiment of the present invention.
Figure 7:
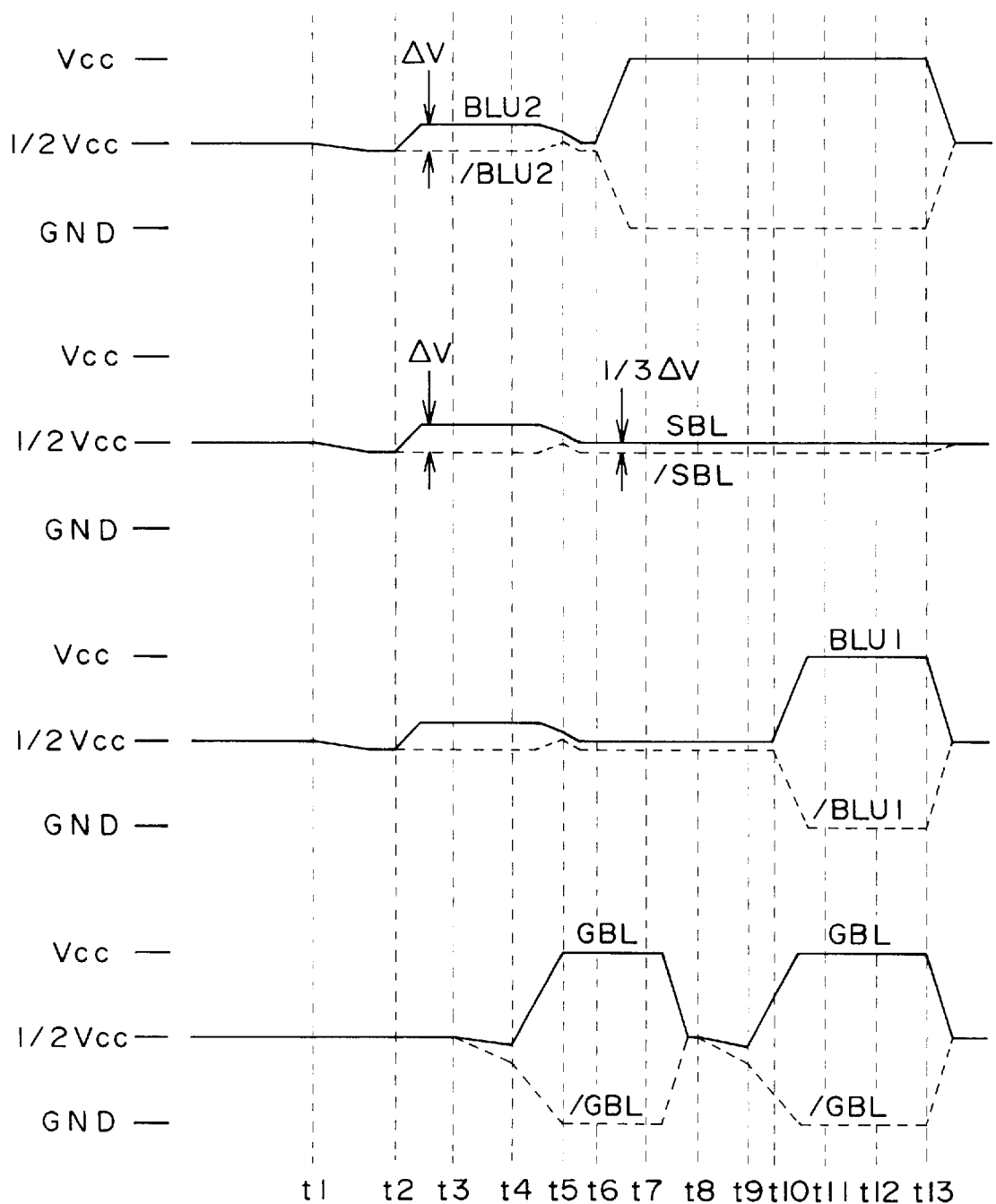
FIG. 7 shows waveforms for explaining a reading operation for bit lines of the semiconductor memory device of the second embodiment of the present invention.
Figure 8:
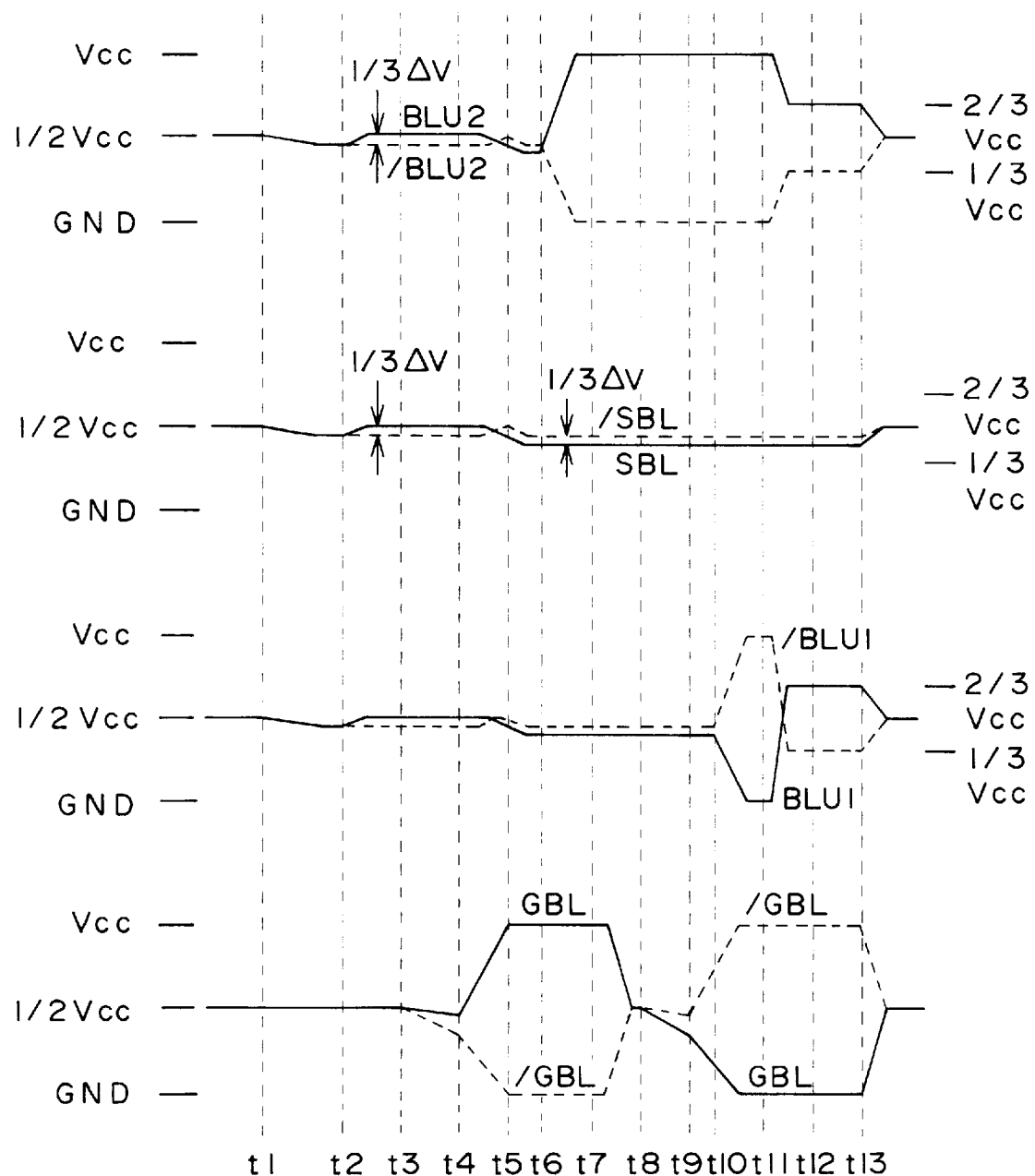
FIG. 8 shows waveforms for explaining a reading operation for bit lines of the semiconductor memory device of the second embodiment of the present invention.

FIG. 5 shows memory cells and circuits for reading out and writing data of the semiconductor memory device of the second embodiment of the present invention. FIG. 6 shows timing waveforms for explaining an operation of the semiconductor memory device shown in FIG. 5. FIGS. 7 and 8 show waveforms at bit lines at reading operation for explaining the operation of the circuit of FIG. 5.

Referring to FIG. 5, in the semiconductor memory device of the second embodiment, the constitutions of the sense amplifier, the reading circuit, and the bit line precharge circuit are the same as those of the foregoing first embodiment. However, the constitution of the memory cell array and the waveforms of the input timing are different from those of the first embodiment.

The reading operation of the data stored in the memory cell 1 selected by the word line WL1 and the sub-bit line BLU1 will be described with reference to FIG. 6.

First, in the similar manner to the first embodiment, at time t0 of FIG. 6, the signals PDL and TGL change as shown in FIG. 6, whereby precharging of the sub-bit lines is completed. Thus, the bit lines BLL1 and /BLL1 disposed at the bottom of FIG. 5 are separated from the sub-sense amplifier.

Moreover, at time t1, an operation for correcting the variations of the threshold voltages of the sense amplifier transistors is performed. At time t2, the level at the word line WL1 rises, whereby the data stored in the storage capacitor 2 is read out on the sub-bit lines BLU1, BLU2, and SBL.

Subsequently, at time t3, the signal RS rises up, the potential difference between the sub-bit lines is transferred to the main bit lines. At time t4, the potential difference between the main bit lines is amplified by a main sense amplifier (not shown).

At this time, the variations of the potentials at the main bit lines are transferred to the sub-bit lines by the capacitors 12 and 13 in the sub-sense amplifier as shown in FIGS. 7 and 8. Thus, the potentials at the sub-bit lines vary by $\frac{1}{3} \Delta V$ in the similar manner to the first embodiment.

Thereafter, at time t5, the signals TGU and CPE change as shown in FIG. 6. At time t6, the signal WSU rises up, the amplified levels at the main bit lines are written to the sub-bit lines BLU1, /BLU1, BLU2, and /BLU2, respectively.

The operations from time t0 to time t6 are similar to those of the foregoing first embodiment. At time t7, the signal WSU rises up, and, at the same time, the signal CTGU also rises up, whereby the sub-bit lines BLU1 and the BLU2 are separated from each other, and the sub-bit lines /BLU1 and /BLU2 are separated from each other.

Subsequently, the main bit lines are precharged to ½ Vcc. At time t8, the signal RS rises up again, the data of the subordinate bit is transferred to the main bit lines. The data of the superordinate and subordinate bits are transferred to the main bit lines from the sub-bites lines. The principle of the reading operation is similar to that of the first embodiment.

Next, at time t9, the data of the subordinate bits transferred to the main bit lines is amplified by a sense amplifier (not shown). At time t10, the signal WSU rises up again, whereby the voltage at the level of the main bit lines is written to the sub-bit lines BLU1 and /BLU1. At this time, since the signal CTGU is at the level GND and the writing data is at an off state, the writing level of the superordinate bits is stored in the sub-bit lines BLU2 and /BLU2.

Thereafter, the write switch signal WSU drops. At time t11, the signal CTGU rises up, whereby the sub-bit lines BLU1 and BLU2 are connected. At the same time, the sub-bit lines /BLU1 and /BLU2 are also connected. At this time, the sub-bit line BLU2 has a parasitic capacitance of a value corresponding to 2n word lines, that is, a bit line capacitance having a value 2CB. The sub-bit line has a parasitic capacitance of a value corresponding to n word lines, that is a bit line capacitance having a value CB.

Therefore, after the signal CTGU rises up, in the similar manner to the foregoing embodiment, four voltages of levels Vcc, ⅔ Vcc, ⅓ Vcc, and GND are written to the sub-bit lines and the storage node 4. Thereafter, at time t12, the potential at the word line WL1 drops, whereby the reading and re-writing operations are finished.

In the writing operation, in the similar manner to the foregoing first embodiment, while the signal WSU is energized, that is, for the period of time from time t6 to time t7 and from time t10 to time t11, the data corresponding to the superordinate and subordinate bits of the writing data may be sequentially written to the sub-bit lines from a main sense amplifier (not shown) through the main bit lines.

Figure 9:
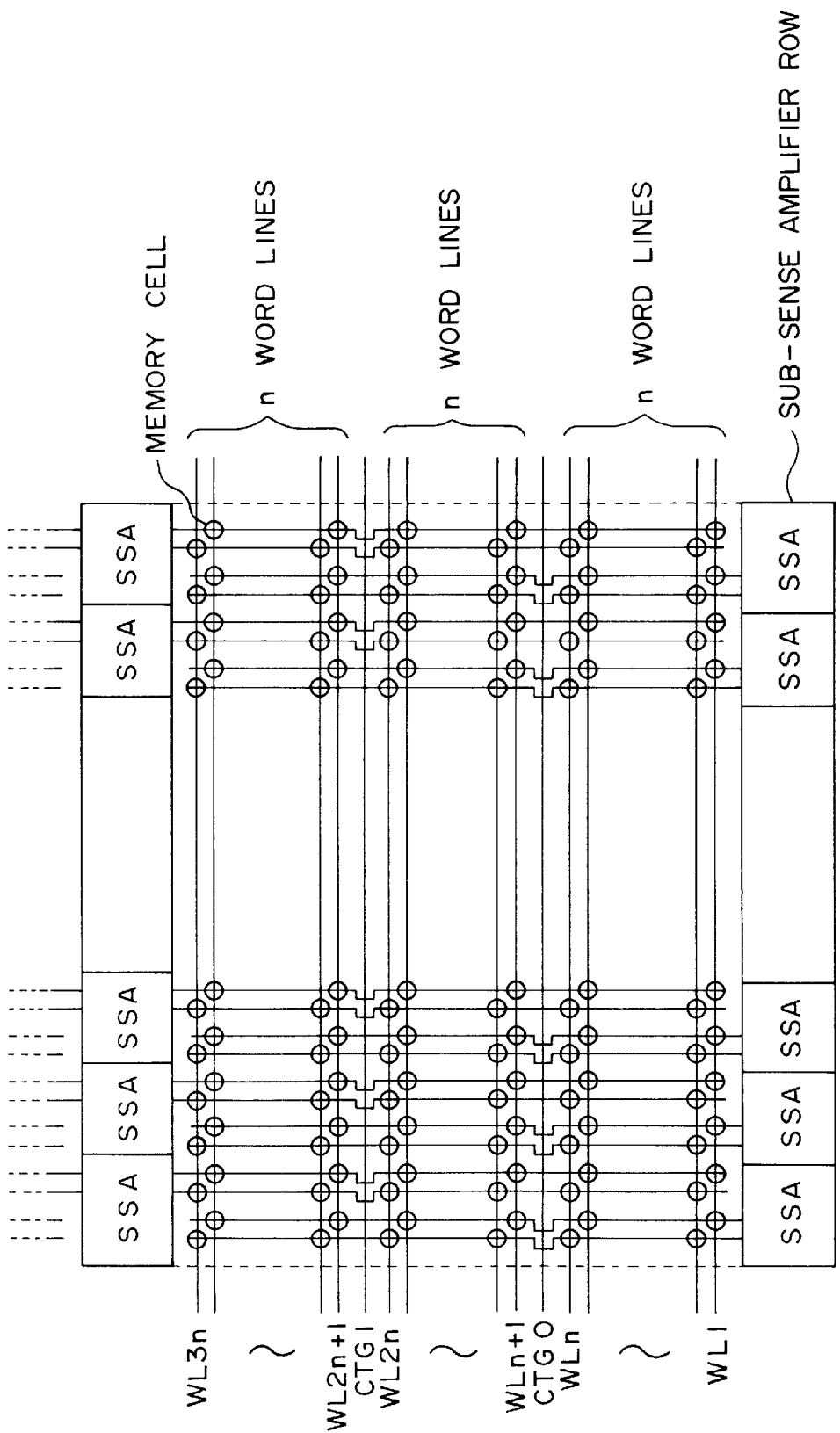
FIG. 9 is a circuit diagram showing a constitution of a memory cell array of the semiconductor memory device of the second embodiment of the present invention.
Figure 10:
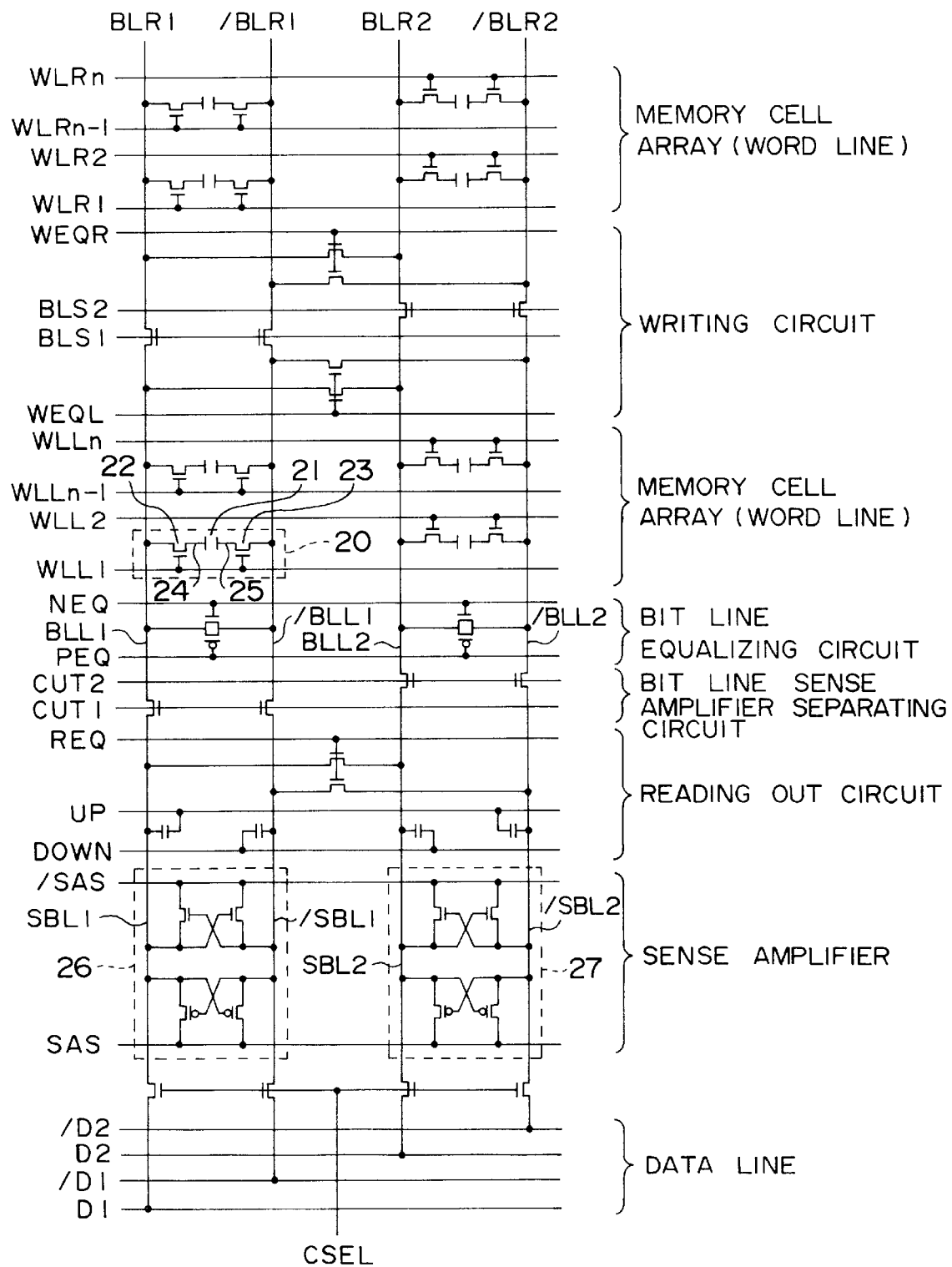
FIG. 10 is a circuit diagram showing a constitution of a conventional semiconductor memory device.
Figure 11:
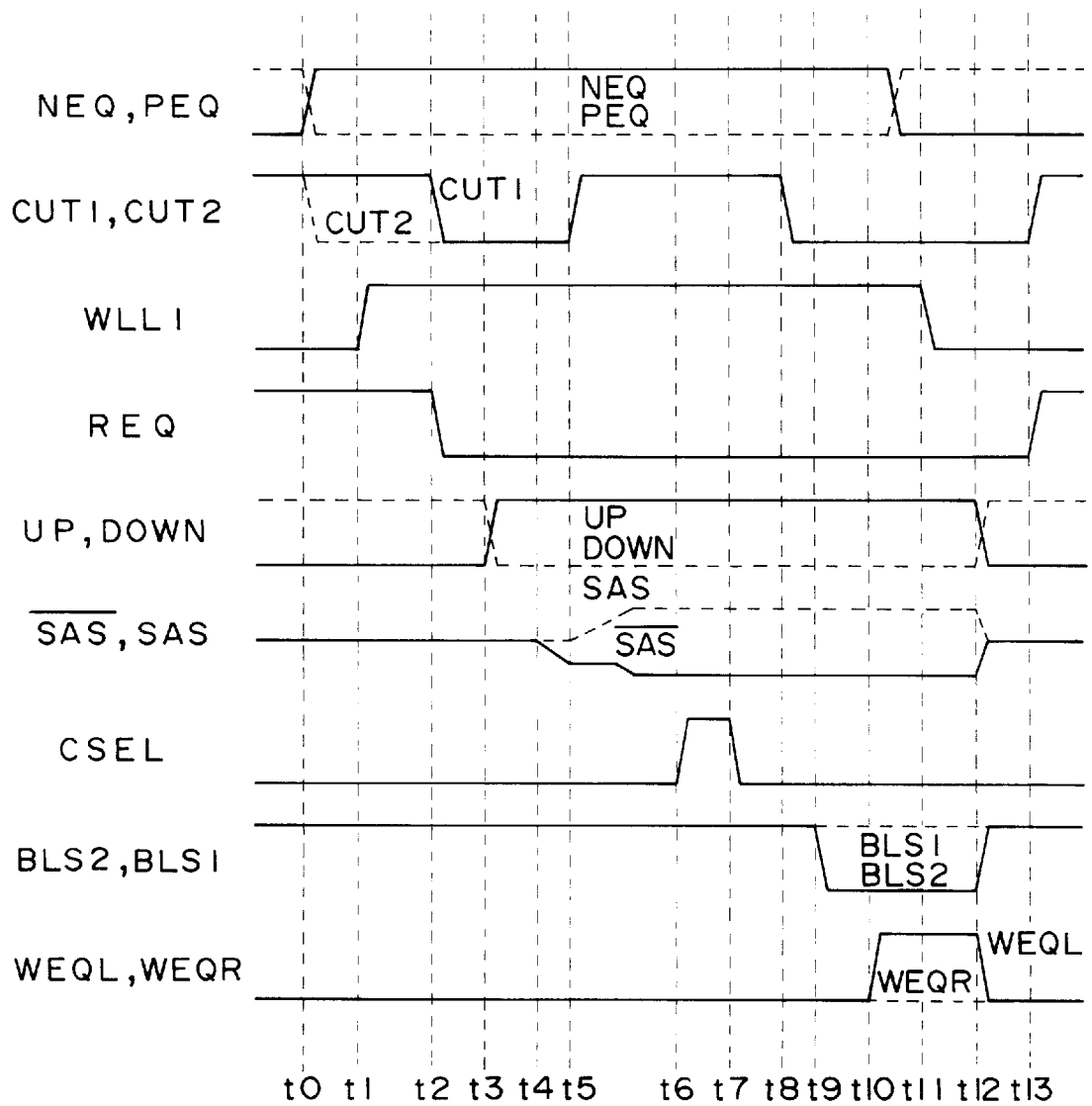
FIG. 11 shows input timing waveforms of the conventional emiconductor memory device.
Figure 12:
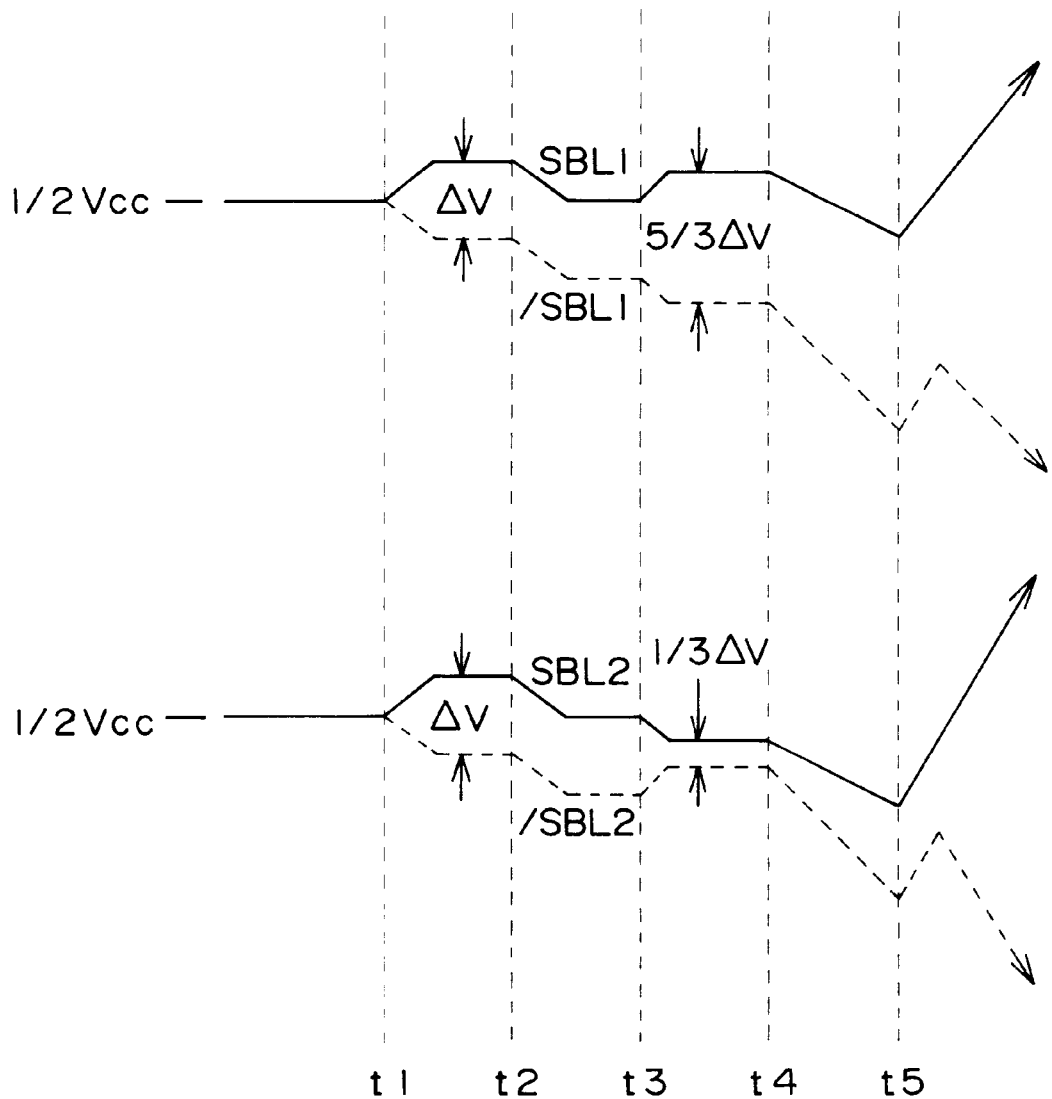
FIG. 12 shows waveforms for explaining a reading operation or bit lines of the conventional semiconductor memory device.
Figure 13:
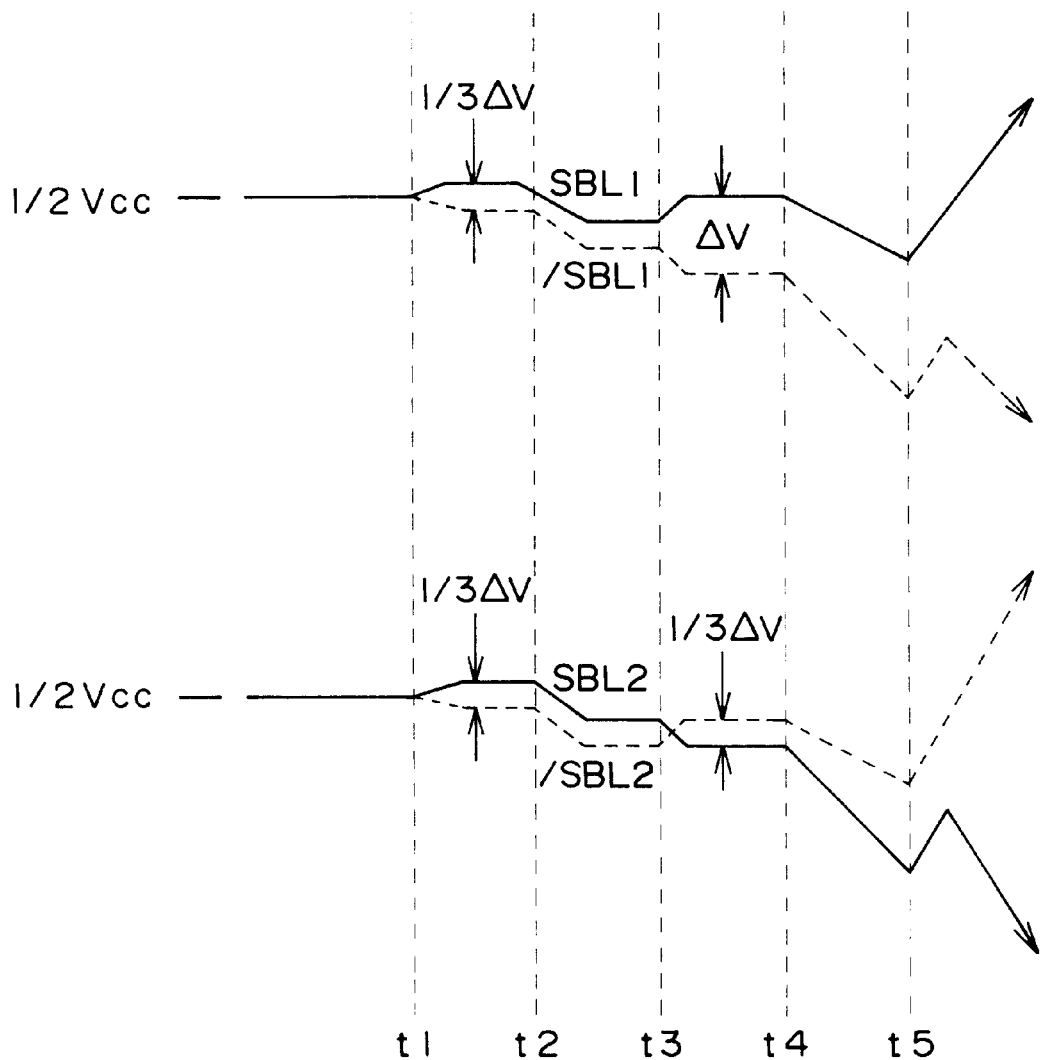
FIG. 13 shows waveforms for explaining a reading operation for bit lines of the conventional semiconductor memory device.

In FIG. 9, a constitution example of a memory cell array using the circuit of the second embodiment of the present invention will be described. As shown in FIG. 9, the sub-sense amplifiers can be arranged between the memory cell arrays. The word lines are grouped together in three blocks, each consisting of the n word lines. The line for the signal CTGL of the upper row of he sub-sense amplifiers and the line for the signal CTGU of the lower row of the sub-sense amplifiers can be arranged as shown in FIG. 9. Thus, the reading and writing operations for the data of all memory cells can be correctly performed.

Moreover, in the system of the foregoing first embodiment, in order to create the four potential states at the rewriting operation, the bit line capacitances for both of one sub-bit line (for example, BLU1 and BLU2) and the other sub-bit line (for example, BLL1) of the sub-sense amplifier are required. Therefore, dummy sub-bit lines used as parasitic capacitances for re-writing is also necessary at the further outer positions of the sub-sense amplifier disposed at the outermost positions of the memory cell array.

On the contrary, in this system of the second embodiment, only one sub-bit line of the sub-sense amplifier is used so that a dummy sub-bit line are not required.

As described above, according to the present invention, the memory cell of the peculiar structure, as described in the prior art, which consists of two transistors and one capacitor, is not used. With the memory cell structure similar to that of the conventional dynamic type semiconductor memory device, data for two bits can be stored in one memory cell. Therefore, a chip area is significantly reduced. Moreover, the usage of the classified bit line structure enables to read out many data at one time. Therefore, the semiconductor memory device of the present invention is suitable for a high speed operation such as file memories.

What is claimed is:

1. A semiconductor memory device comprising:
   at least one pair of main bit lines,
   at least one pair of sub-bit lines,
   a first sense amplifier coupled to said pair of main bit lines,
   a second sense amplifier coupled to said pair of sub-bit lines,
   a plurality of word lines each intersecting said pair of sub-bit lines,
   a plurality of memory cells each disposed at a different one of intersections of said word lines and said pair of sub-bit lines,
   a first series circuit including a first capacitor and a first transfer gate coupled in series between one of said pair of main bit lines and one of said pair of sub-bit lines; and
   a second series circuit including a second capacitor and a second transfer gate coupled in series between the other of said pair of main bit lines and the other of said pair of sub-bit lines.

2. A semiconductor memory device comprising:
   a memory cell,
   a main bit line,
   a sub-bit line,
   a first sense amplifier coupled to said main bit line,
   a second sense amplifier coupled to said sub-bit line,
   a series circuit including a capacitor and a transfer gate coupled in series between said main bit line and said sub-bit line; and
   a control circuit rendering said transfer gate conductive while said first and second sense amplifiers are being activated and deactivated, respectively, to change a potential on said sub-bit line in accordance with a potential on said main bit line.

3. The memory device as claimed in claim 2, further comprising:
   a word line, said memory cell being coupled to said sub-bit line and said word line, said second sense amplifier being activated to transfer data read out of said memory cell from said sub-bit line to said main bit line before said transfer gate is rendered conductive, and said second sense amplifier being activated again after said transfer gate is rendered conductive.

4. A semiconductor memory device comprising:
   a main bit line,
   a sub-bit line,
   a first sense amplifier coupled to said main bit line,
   a second sense amplifier coupled to said sub-bit line,
   a plurality of word lines each intersecting said sub-bit lines,
   a plurality of memory cells each disposed at a different one of intersections of said word lines and said sub-bit line,
   a series circuit including a capacitor and a transfer gate coupled in series between said main bit line and said sub-bit line; and
   a control circuit selecting one of said word line to designate one of said memory cells: wherein
   said first and second sense amplifiers are activated two times, respectively, such that first activation of said second sense amplifier causes a first potential based upon data stored in said one of said memory cells to be transferred from said sub-bit line to said main bit line, a first activation of said first sense amplifier causes said first potential on said main bit line to be amplified up to a second potential, said second potential being fed back to said sub-bit line through said series circuit to change a potential on said sub-bit line to a third potential, a second activation of said second sense amplifier causes a third potential to be transferred from said sub-bit line to said main bit line, and a second activation of said first sense amplifier causes said third potential on said main bit line to be amplified up to a fourth potential.

5. A semiconductor memory device comprising:

a pair of main bit lines, a pair of sub-bit lines, a first series circuit including a first capacitor and a first transfer gate coupled in series between one of said main bit lines and one of said sub-bit lines, a second series circuit including a second capacitor and a second transfer gate coupled in series between the other of said main bit lines and the other of said sub-bit lines; and a control circuit transferring a difference in potential between said sub-bit lines responsive to a selected memory cell to said main bit lines, amplifying a potential difference between said main bit lines and feeding back an amplified potential difference back to said sub-bit lines through said first and second series circuits, and transferring again a potential difference between said sub-bit lines to said main bit lines.

6. The memory device according to claim 5, further comprising:

a pair of transfer gates each provided to divide an associated one of said sub-bit lines into two portions, said transfer gates being turned on after said potential between said sub-bit lines is transferred again to said main bit lines.

\* \* \* \* \*